(12) United States Patent
Horai et al.

(10) Patent No.: US 7,535,268 B2
(45) Date of Patent: May 19, 2009

(54) INDUCTIVE LOAD DRIVING SYSTEM

(75) Inventors: Yasuharu Horai, Tochigi (JP);
Yasutoshi Aso, Tochigi (JP)

(73) Assignee: Keihin Corporation, Tokyo (JP)

( * ) Notice: Subject to any disclaimer, the term of this patent is extended or adjusted under 35 U.S.C. 154(b) by 49 days.

(21) Appl. No.: 11/902,565

(22) Filed: Sep. 24, 2007

(65) Prior Publication Data

US 2008/0074157 A1  Mar. 27, 2008

(30) Foreign Application Priority Data

Sep. 27, 2006   (JP) ............................ 2006-262583

(51) Int. Cl.
*H03B 1/00* (2006.01)
*H03K 3/00* (2006.01)

(52) U.S. Cl. ...................... 327/110; 307/104
(58) Field of Classification Search ................. 327/110; 307/98, 104

See application file for complete search history.

(56) References Cited

U.S. PATENT DOCUMENTS

| | | | | |
|---|---|---|---|---|
| 5,638,012 | A * | 6/1997 | Hashimoto et al. | 327/110 |
| 5,811,996 | A * | 9/1998 | Oyabe et al. | 327/110 |
| 6,335,643 | B1 * | 1/2002 | Ono | 327/108 |
| 6,781,423 | B1 * | 8/2004 | Knoedgen | 327/110 |
| 7,091,752 | B2 * | 8/2006 | Balakrishnan | 327/108 |
| 7,408,388 | B2 * | 8/2008 | Nagasawa et al. | 327/110 |
| 2004/0150433 | A1 * | 8/2004 | Hourai | 327/110 |
| 2008/0074157 | A1 * | 3/2008 | Horai et al. | 327/110 |

FOREIGN PATENT DOCUMENTS

| | | | |
|---|---|---|---|
| JP | 05-008413 | | 1/1993 |
| JP | 05206816 A | * | 8/1993 |
| JP | 11055937 A | * | 2/1999 |
| JP | 2008085046 A | * | 4/2008 |

* cited by examiner

*Primary Examiner*—Kenneth B Wells
*Assistant Examiner*—Adam D Houston
(74) *Attorney, Agent, or Firm*—Westerman, Hattori, Daniels & Adrian, LLP.

(57) ABSTRACT

In an inductive load driving system, it is configured to comprise a first switching element that is inserted in a position between the external power supply and the inductive load, a second switching element that is inserted in a position between the inductive load and the ground, a return current circuit including a first branch path which diverges at a location between the first switching element and the inductive load to be connected to the ground, that returns counter electromotive current to the ground when the second switching element is turned on, and a counter electromotive current reduction circuit including a second branch path which diverges at a location between the inductive load and the second switching element to be connected to the external power supply, that reduces the counter electromotive current to the external power supply when the first and second switching elements are turned off.

9 Claims, 4 Drawing Sheets

INDUCTIVE LOAD DRIVING SYSTEM

BACKGROUND OF THE INVENTION

1. Field of the Invention

This invention relates to a system for driving an inductive load.

2. Description of the Related Art

Conventionally, a system that drives an inductive load such as an electromagnetic solenoid or electric motor is configured to turn on and off a switching element inserted in a location between an external power supply and the inductive load in an energization circuit of the inductive load in response to a pulse signal, so as to control energization from the external power supply to the inductive load and conduct duty (PWM) drive of the inductive load. Although, when energization to the inductive load is cut off, counter electromotive voltage is generated by the inductive load, counter electromotive current generated thereby is returned to a ground through a flywheel diode in order to prevent the energization circuit from being damaged by the counter electromotive voltage, as taught, for example, in Japanese Laid-Open Patent Application No. Hei 5(1993)-8413, especially in FIG. 1.

Since the known system is also equipped with a counter electromotive force absorbing circuit that absorbs counter electromotive voltage using a zener diode for attenuating the returned counter electromotive current and is configured to turn on and off a second switching element inserted in a position downstream of the inductive load, it can control return of counter electromotive current and absorption of counter electromotive voltage, thereby enabling to achieve a desired attenuation characteristic with respect to the energization amount of the inductive load after cutting off energization from the external power supply.

However, when counter electromotive voltage equal to or greater than a predetermined value (i.e., a breakdown voltage value of the zener diode) affects, the above-mentioned counter electromotive force absorbing circuit is conducted and absorbs counter electromotive voltage by an amount corresponding to the predetermined value. It causes a disadvantage to make the system itself overheat and the overheat leads to malfunction of the inductive load driving system.

SUMMARY OF THE INVENTION

An object of the present invention is therefore to overcome the foregoing drawback by providing an inductive load driving system that can prevent overheat from occurring when absorbing counter electromotive voltage.

In order to achieve the object, the present invention provides a system for driving an inductive load to which an external power supply and a ground are connected, comprising: a first switching element inserted in a position between the external power supply and the inductive load to be turned on and off in response to a first driving signal; a second switching element inserted in a position between the inductive load and the ground to be turned on and off in response to a second driving signal; a return current circuit including a first branch path which diverges at a location between the first switching element and the inductive load to be connected to the ground, the return current circuit returning counter electromotive current generated due to counter electromotive voltage of the inductive load to the ground when the second switching element is turned on, and a counter electromotive current reduction circuit including a second branch path which diverges at a location between the inductive load and the second switching element to be connected to the external power supply, the counter electromotive current reduction circuit reducing the counter electromotive current to the external power supply when the first and second switching elements are turned off.

BRIEF DESCRIPTION OF THE DRAWINGS

The above and other objects and advantages of the present invention will be more apparent from the following description and drawings in which.

DETAILED DESCRIPTION OF THE PREFERRED EMBODIMENTS

An inductive load driving system according to preferred embodiments of the present invention will now be explained with reference to the attached drawings.

Figure 1:
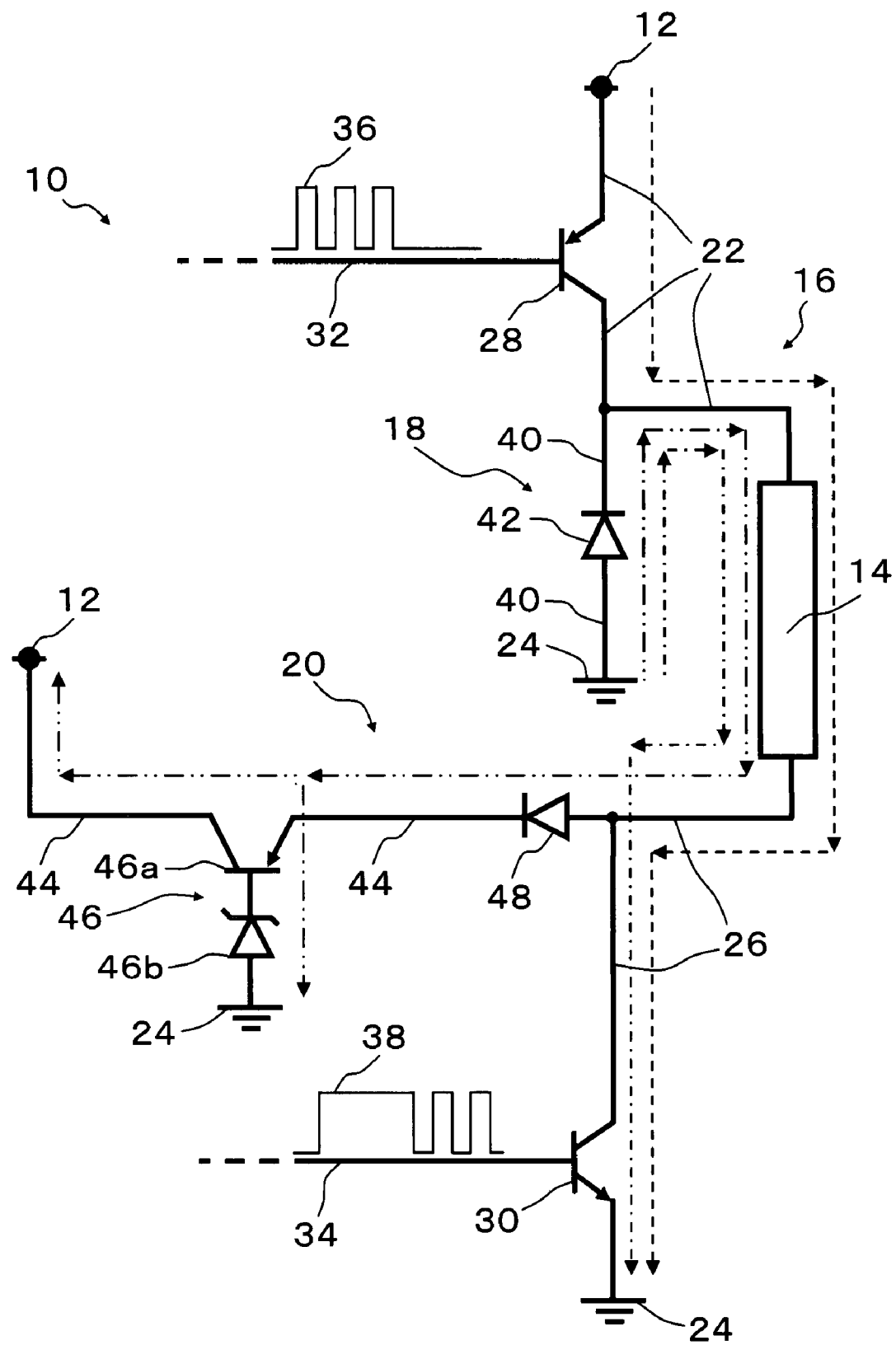
FIG. 1 is a schematic view of an electric circuit constituting an inductive load driving system according to a first embodiment of the invention.

FIG. 1 is a schematic view of an electric circuit constituting an inductive load driving system according to a first embodiment of the invention.

In FIG. 1, reference numeral 10 designates a system for driving an inductive load. Here, the inductive load indicates an electromagnetic actuator, e.g., an electromagnetic solenoid or electric motor, that is driven by energization to a solenoid coil.

As shown in FIG. 1, the inductive load driving system 10 comprises an energization circuit 16 that is supplied with electric power from an external power supply 12 to energize the inductive load 14, a return current circuit 18 that returns current (hereinafter called "counter electromotive current") generated due to counter electromotive voltage of the inductive load 14 and a counter electromotive current reduction circuit 20 that reduces the counter electromotive current of the inductive load 14 to the external power supply 12. The external power supply 12 is installed outside of the inductive load driving system 10.

The energization circuit 16 is composed of an electric path 22 connecting the external power supply 12 to the inductive load 14 and an electric path 26 connecting the inductive load 14 to a ground 24. The electric path 22 is inserted with a first switching element 28 having a PNP transistor and the electric path 26 with a second switching element 30 having a NPN transistor. The first and second switching elements 28, 30 are connected via signal lines 32, 34, respectively, to a controller (not shown).

The first and second switching elements 28, 30 are turned on and off in response to first and second driving signals 36, 38 sent from the controller. When the first and second switching elements are both turned on, the inductive load 14 is supplied with electric power from the external power supply 12 and current flows to a direction indicated by an arrow of dashed line in FIG. 1. When either one of the first and second switching elements 28, 30 is turned off, the energization from the external power supply 12 to the inductive load 14 is cut off.

The return current circuit 18 is composed of an electric path 40 diverging from the electric path 12 at a location between the first switching element 28 and inductive load 14 to be connected to the ground 24, and the electric paths 22, 26. The electric path 40 is inserted with a flywheel diode 42, such that an anode terminal of the flywheel diode 42 is connected to the ground 24 side and a cathode terminal thereof to the inductive load 14 side.

When the first switching element 28 is turned off to cut off the energization from the external power supply 12 to the inductive load 14, counter electromotive voltage which works to maintain the energization is generated in the inductive load 14. When the second switching element 30 is turned on, counter electromotive current caused by the counter electromotive voltage is returned from the ground 24 through the electric path 40, flywheel diode 42, electric path 22, inductive load 14 and electric path 26 to the ground 24, as indicated by an arrow of dashed dotted line in FIG. 1. At the time, the diode 42 loses electric power by an amount corresponding to the forward voltage drop.

The counter electromotive current reduction circuit 20 is composed of an electric path 44 diverging from the electric path 26 at a location between the inductive load 14 and second switching element 30 to be connected to the external power supply 12, and the electric paths 22, 26, 40. The electric path 44 is disposed with a third switching element 46.

The third switching element 46 has a PNP transistor 46a and zener diode 46b. Specifically, an emitter terminal of the PNP transistor 46a is connected to the inductive load 14 side, a collector terminal thereof to the external power supply 12 side and a base terminal thereof to the ground 24 side. A cathode terminal of the zener diode 46b is connected to the PNP transistor base terminal side and an anode terminal thereof to the ground 24 side. A diode 48 is installed in the electric path 44 to regulate a current direction in the counter electromotive current reduction circuit 20.

As described in the foregoing, the counter electromotive voltage is generated by turning off the first switching element 28 to cut off energization to the inductive load 14. If the counter electromotive voltage exceeds voltage of the external power supply 12, when the second switching element 30 is turned off, the counter electromotive current caused by the counter electromotive voltage flows from the ground 24 through the electric path 40, flywheel diode 42, electric path 22, inductive load 14, electric path 26 and electric path 44 to the external power supply 12, as indicated by an arrow of dashed two-dotted line in FIG. 1. Specifically, in the case that the counter electromotive voltage exceeds voltage of the external power supply 12, when the second switching element 30 is turned off, the counter electromotive current generated by the inductive load 14 is reduced to the external power supply 12 through the counter electromotive current reduction circuit 20. In other words, the counter electromotive voltage is absorbed by the external power supply 12. Owing to this configuration, absorption of the counter electromotive voltage does not cause overheat of the inductive load driving system 10.

Further, since the electric path 44 is inserted with the third switching element 46 having the PNP transistor 46a and zener diode 46b, when the counter electromotive voltage greater than a breakdown voltage value of the zener diode 46b affects the third switching element 46 to conduct the zener diode 46b, the PNP transistor 46a is conducted between its emitter and collector terminals. Specifically, at the time, the third switching element 46 is turned on and the counter electromotive current flows to the external power supply 12. It should be noted that the counter electromotive current flowing between the emitter and base terminals of the PNP transistor 46a is only slight amount compared with that flowing between the emitter and collector terminals thereof.

On the other hand, when the counter electromotive voltage equal to or smaller than the breakdown voltage value of the zener diode 46b affects the third switching element 46, it does not conduct the zener diode 46b and also does not conduct between the emitter and collector terminals of the PNP transistor 46a. Specifically, in this case, the third switching element 46 is turned off and the counter electromotive voltage does not flow to the external power supply 12.

Thus, in the counter electromotive current reduction circuit 20, the third switching element 46 is turned on and off in response to the affecting counter electromotive voltage and, when the third switching element 46 is turned on, the counter electromotive current flows to the external power supply 12. In other words, in the counter electromotive current reduction circuit 20, when the third switching element 46 is turned on, the counter electromotive current is reduced to the external power supply 12. The breakdown voltage value of the zener diode 46b is set to be greater than voltage of the external power supply 12. With this, the counter electromotive current can be reduced to the external power supply 12 without depending on the voltage of the external power supply 12.

Reduction of the counter electromotive current to the external power supply 12 energizes the zener diode 46b and turns the third switching element 46 on and hence, a part of the counter electromotive voltage is absorbed by the third switching element 46.

It will be explained to be more specific. When the breakdown voltage value of the zener diode 46b is assigned with Vz and voltage of the external power supply 12 with VB, voltage drop of the third switching element 46 can be expressed as Vz−VB. With this, in the counter electromotive current reduction circuit 20, when the third switching element 46 is turned on, a part (Vz−VB) of the counter electromotive voltage is absorbed by the third switching element 46, while the remainder VB thereof is absorbed by the external power supply 12. A part (Vz−VB) of the counter electromotive voltage is a value in response to the breakdown voltage value Vz of the zener diode 46b.

It should be noted that, even if the counter electromotive voltage exceeding the breakdown voltage value Vz affects the third switching element 46 to be operated and absorb the counter electromotive voltage, absorption of merely a part of the counter electromotive voltage does not cause overheat. Further, upon changing the breakdown voltage Vz by appropriately selecting the zener diode 46b, absorbing amount of counter electromotive voltage by the third switching element 46 and reducing amount thereof to the external power supply 12 can be easily changed.

Figure 2:
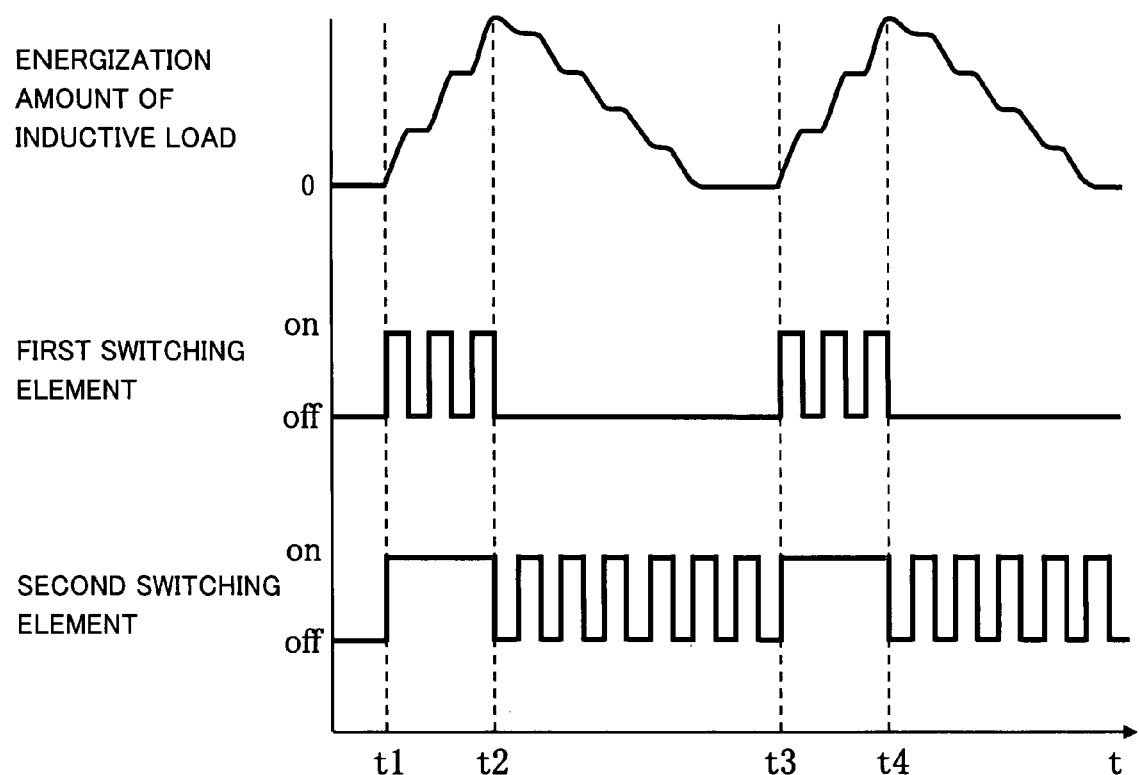
FIG. 2 is a time chart showing relationship between the operation of first and second switching elements and an energization amount of an inductive load in the inductive load driving system shown in FIG. 1.

FIG. 2 is a time chart showing relationship between operation of the first and second switching elements 28, 30 and an energization amount of the inductive load 14 in the inductive load driving system 10 shown in FIG. 1.

In a time period from t1 to t2 in FIG. 2, the second switching element 30 is continuously on in response to the second driving signal 38, while the first switching element 28 is turned on and off in response to the first driving signal 36, which is a pulse signal. In the period from t1 to t2, the energization amount of the inductive load 14 increases with increasing time of the first switching element 28 being on. When the first switching element 28 is turned off, the counter electromotive voltage by the inductive load 14 is generated and the counter electromotive current caused thereby is returned through the return current circuit 18. With this, the energization amount of the inductive load 14 is maintained constant or slightly decreased.

Thus the energization amount of the inductive load 14 in the time period from t1 to t2 is controlled by turning the first switching element 28 on and off. Specifically, the inductive load 14 is operated in the so-called duty (PWM) drive method. With this, energization of the inductive load 14 can obtain a desired rise characteristic.

In a time period from t2 to t3 in FIG. 2, the first switching element 28 is continuously off in response to the first driving signal 36, while the second switching element 30 is turned on and off in response to the second driving signal 38, which is a pulse signal. With this, the current flowing to the inductive load 14 is gradually decreased.

Specifically, when the first switching element 28 is turned off at t2, the counter electromotive force due to the inductive load 14 is generated. When the second switching element 30 is turned on, the counter electromotive current is returned through the return current circuit 18. As a result, the energization amount of the inductive load 14 is maintained constant or slightly decreased. When the second switching element 30 is turned off, since the counter electromotive current flows through the counter electromotive current reduction circuit 20 to the external power supply 12, i.e., it is reduced to or absorbed by the external power supply 12, the energization amount of the inductive load 14 is sharply decreased.

Thus the energization amount of the inductive load 14 in the time period from t2 to t3 is controlled by turning the second switching element 30 on and off. With this, energization of the inductive load 14 can obtain a desired decay characteristic. It should be noted that the foregoing operation is repeated from t3 onwards.

As stated above, in the inductive load driving system 10 according to the first embodiment, it is configured to comprise the first switching element 28 inserted in a position between the external power supply 12 and the inductive load 14 to be turned on and off in response to the first driving signal 36; the second switching element 30 inserted in a position between the inductive load 14 and the ground 24 to be turned on and off in response to the second driving signal 38; the return current circuit 18 including the electric path (first branch path) 40 which diverges at a location between the first switching element 28 and the inductive load 14 to be connected to the ground 24, the return current circuit 18 returning counter electromotive current generated due to counter electromotive voltage of the inductive load 14 to the ground when the second switching element 30 is turned on, and the counter electromotive current reduction circuit 20 including the electric path (second branch path) 44 which diverges at a location between the inductive load 14 and the second switching element 30 to be connected to the external power supply 12, the counter electromotive current reduction circuit 20 reducing the counter electromotive current to the external power supply 12 when the first and second switching elements 28, 30 are turned off. In other words, it is configured such that the counter electromotive voltage generated by the inductive load 14 is absorbed by the external power supply 12. Owing to this configuration, it becomes possible to prevent overheat of the inductive load driving system 10 from occurring when absorbing the counter electromotive voltage.

Further, it is configured to include the third switching element 46 inserted in the electric path 44 to be turned on and off in response to counter electromotive power affected when the first and second switching elements 28, 30 are turned off, and the counter electromotive current reduction circuit 20 reduces the counter electromotive current to the external power supply 12 when the third switching element 46 is turned on. With this, the counter electromotive current can be reduced to the external power supply 12 without depending on the voltage of the external power supply 12.

Further, since it is configured such that the third switching element 46 includes the transistor 46a and the zener diode 46b inserted in a position between the base terminal of the transistor 46a and the ground 24 to be turned on when the zener diode 46b is conducted by the counter electromotive voltage, the counter electromotive current reduction circuit 20 can reduce the counter electromotive current to the external power supply 12 in response to the counter electromotive voltage affecting the third switching element 46 in spite of the simple structure. In addition, when the third switching element 46 is turned on, the counter electromotive current reduction circuit 20 can absorb a part (Vz−VB) of the counter electromotive voltage, which is a value in response to the breakdown voltage value Vz of the zener diode 46b.

An inductive load driving system according to a second embodiment of the invention will now be explained.

Figure 3:
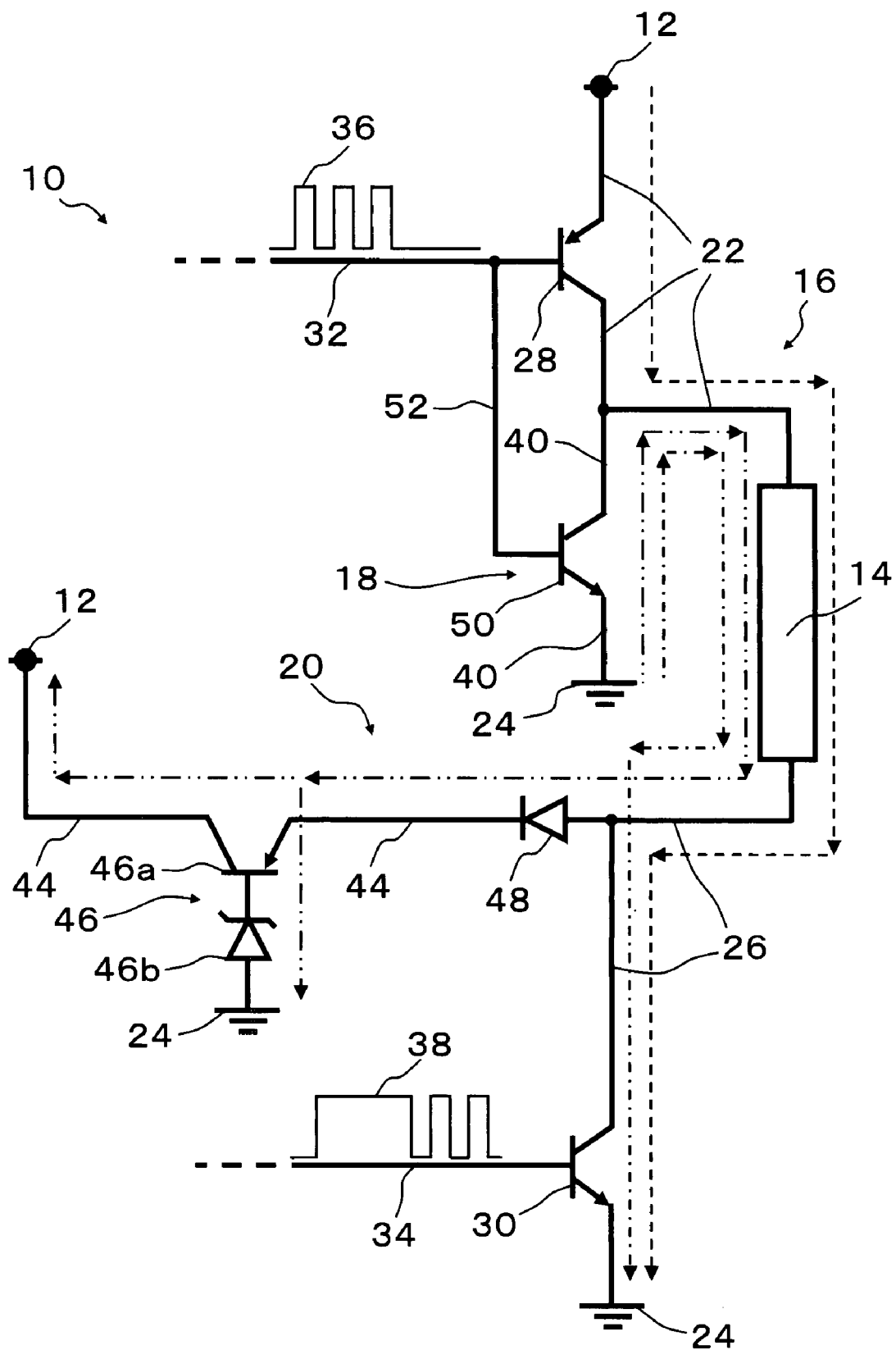
FIG. 3 is a schematic view, similar to FIG. 1, of an electric circuit constituting an inductive load driving system according to a second embodiment of the invention.
Figure 4A:
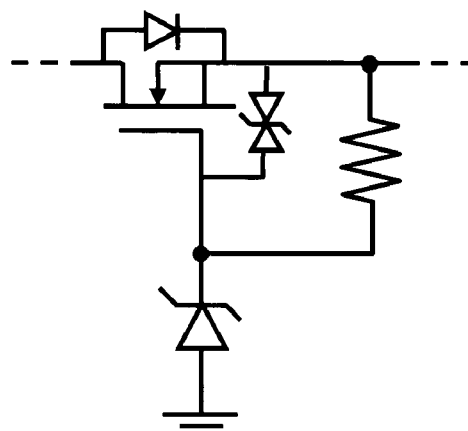
FIG. 4 is a set of schematic views of electric circuits each showing an alternative example of a third switching element in the inductive load driving system shown in FIG. 1.
Figure 4B:
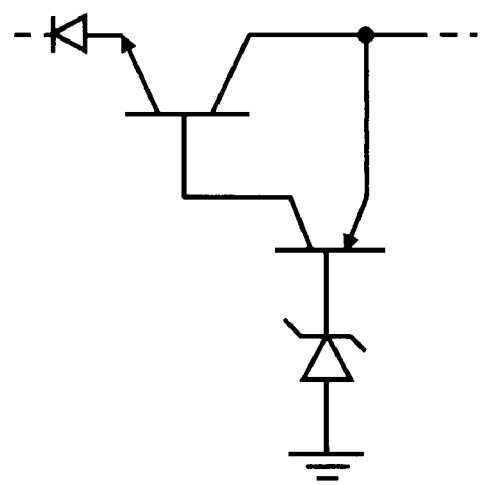
Figure 4C:
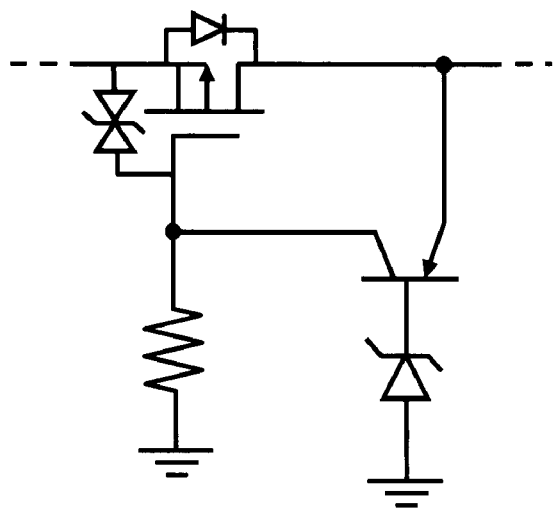
Figure 4D:
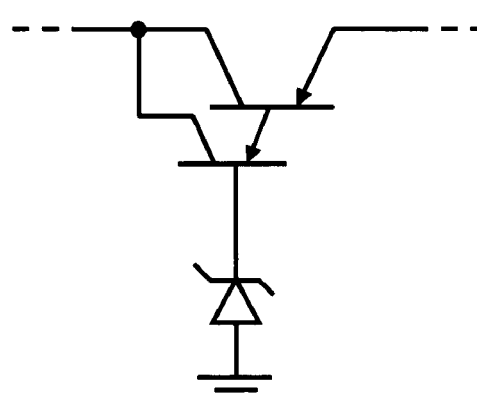

FIG. 3 is a schematic view, similar to FIG. 1, of an electric circuit constituting an inductive load driving system according to a second embodiment of the invention. Note that constituent elements corresponding to those of the first embodiment are assigned by the same reference symbols as those in the first embodiment and will not be explained.

The explanation will be made with focus on points different from the first embodiment. In the second embodiment, it is configured to insert a fourth switching element 50 in the return current circuit 18 in place of the flywheel diode 42.

As shown in FIG. 3, the fourth switching element 50 constituted of an NPN transistor is inserted in the electric path 40. Specifically, the electric path 40 is inserted with the fourth switching element 50 such that an emitter terminal of the fourth switching element 50 is connected to the ground 24 side and a collector terminal thereof to the inductive load 14 side. A base terminal of the fourth switching element 50 is connected via a signal line 52 to the signal line 32 interconnecting the first switching element 28 and controller (not shown).

The first and fourth switching elements 28, 50 are both operated in response to the first driving signal 36. Since the first switching element 28 is the PNP transistor and the fourth switching element 50 is the NPN transistor, the two switching elements 28, 50 are turned on and off alternately each other.

Specifically, since it is configured such that, when the first switching element 28 is turned on, the fourth switching element 50 is turned off, energization from the external power supply 12 to the inductive load 14 is reliably implemented in the energization circuit 16 without the diode 42. On the other hand, since, when the first switching element 28 is turned off, the fourth switching element 50 is turned on, the counter electromotive current caused by the counter electromotive voltage of the inductive load 14 is reliably returned in the return current circuit 18 without the diode 42.

The remaining configuration including the energization circuit 16 and counter electromotive current reduction circuit 20 is the same as that in the first embodiment.

As stated above, in the inductive load driving system 10 according to the second embodiment, since it is configured such that the return current circuit 18 includes the fourth switching element 50 that is turned on and off in response to the first driving signal 36, it is not necessary to install the diode 42 in the return current circuit 18 and it becomes possible to suppress loss of electric power (heating) of an amount corresponding to the forward voltage drop of the diode 42, thereby enabling to still further prevent overheat of the inductive load driving system 10 from occurring.

As described in the foregoing, it is configured in the first and second embodiments of the invention to have a system (10) for driving an inductive load (14) to which an external power supply (12) and a ground (24) are connected, comprising: a first switching element (28) inserted in a position between the external power supply and the inductive load to be turned on and off in response to a first driving signal (36); a second switching element (30) inserted in a position between the inductive load and the ground to be turned on and off in response to a second driving signal (38); a return current circuit (18) including a first branch path (electric path 40) which diverges at a location between the first switching element and the inductive load to be connected to the ground, the return current circuit returning counter electromotive current generated due to counter electromotive voltage of the inductive load to the ground when the second switching element is turned on, and a counter electromotive current reduction circuit (20) including a second branch path (electric path 44) which diverges at a location between the inductive load and the second switching element to be connected to the external power supply, that reduces the counter electromotive current to the external power supply when the first and second switching elements are turned off.

The system further includes: a third switching element (46) inserted in the second branch path to be turned on and off in response to counter electromotive power affected when the first and second switching elements are turned off, and the counter electromotive current reduction circuit reduces the counter electromotive current to the external power supply when the third switching element is turned on.

In the system, the third switching element includes a transistor (46*a*) and a zener diode (46*b*) inserted in a position between a base terminal of the transistor and the ground to be turned on when the zener diode is conducted by the counter electromotive voltage.

In the system, the return current circuit includes a fourth switching element (50) that is turned on and off in response to the first driving signal.

In the system, the first switching element comprises a PNP transistor and a second switching element comprises a NPN transistor.

In the system, the transistor of the third switching element is a PNP transistor.

In the system, the fourth switching element comprises a NPN transistor.

In the system, the inductive load is an electromagnetic solenoid.

In the system, the inductive load is an electric motor.

It should be noted that although the first, second and fourth switching elements are constituted of the PNP transistor or NPN transistor, an N-channel field effect transistor or P-channel field effect transistor can also be applied.

It should further be noted that although the third switching element 46 is configured to have the PNP transistor 46*a* and zener diode 46*b*, circuits of FIGS. 4A to 4D or the like can instead be used.

Japanese Patent Application No. 2006-262583 filed on Sep. 27, 2006, is incorporated herein in its entirety.

While the invention has thus been shown and described with reference to specific embodiments, it should be noted that the invention is in no way limited to the details of the described arrangements; changes and modifications may be made without departing from the scope of the appended claims.

What is claimed is:

1. A system for driving an inductive load to which an external power supply and a ground are connected, comprising:
   a first switching element inserted in a position between the external power supply and the inductive load to be turned on and off in response to a first driving signal;
   a second switching element inserted in a position between the inductive load and the ground to be turned on and off in response to a second driving signal;
   a return current circuit including a first branch path which diverges at a location between the first switching element and the inductive load to be connected to the ground, the return current circuit returning counter electromotive current generated due to counter electromotive voltage of the inductive load to the ground when the second switching element is turned on, and
   a counter electromotive current reduction circuit including a second branch path which diverges at a location between the inductive load and the second switching element to be connected to the external power supply, the counter electromotive current reduction circuit reducing the counter electromotive current to the external power supply when the first and second switching elements are turned off.

2. The system according to claim 1, further including:
   a third switching element inserted in the second branch path to be turned on and off in response to counter electromotive power affected when the first and second switching elements are turned off,
   and the counter electromotive current reduction circuit reduces the counter electromotive current to the external power supply when the third switching element is turned on.

3. The system according to claim 2, wherein the third switching element includes a transistor and a zener diode inserted in a position between a base terminal of the transistor and the ground to be turned on when the zener diode is conducted by the counter electromotive voltage.

4. The system according to claim 1, wherein the return current circuit includes a fourth switching element that is turned on and off in response to the first driving signal.

5. The system according to claim 1, wherein the first switching element comprises a PNP transistor and a second switching element comprises a NPN transistor.

6. The system according to claim 3, wherein the transistor of the third switching element is a PNP transistor.

7. The system according to claim 4, wherein the fourth switching element comprises a NPN transistor.

8. The system according to claim 1, wherein the inductive load is an electromagnetic solenoid.

9. The system according to claim 1, wherein the inductive load is an electric motor.

\* \* \* \* \*